United States Patent
Jeong

(10) Patent No.: US 10,636,703 B2
(45) Date of Patent: Apr. 28, 2020

(54) SEMICONDUCTOR DEVICE FOR PREVENTING CRACK IN PAD REGION AND FABRICATING METHOD THEREOF

(71) Applicant: Magnachip Semiconductor, Ltd., Cheongju-si (KR)

(72) Inventor: Jong-yeul Jeong, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 215 days.

(21) Appl. No.: 15/152,879

(22) Filed: May 12, 2016

(65) Prior Publication Data

US 2016/0260634 A1   Sep. 8, 2016

Related U.S. Application Data

(62) Division of application No. 12/938,325, filed on Nov. 2, 2010, now Pat. No. 9,373,591.

(30) Foreign Application Priority Data

May 10, 2010  (KR) .................. 10-2010-0043415

(51) Int. Cl.
*H01L 21/768*  (2006.01)
*H01L 23/00*  (2006.01)
(Continued)

(52) U.S. Cl.
CPC ...... *H01L 21/76877* (2013.01); *H01L 23/528* (2013.01); *H01L 23/5226* (2013.01);
(Continued)

(58) Field of Classification Search
CPC ......... H01L 24/04; H01L 24/05; H01L 24/08; H01L 2224/04042; H01L 2224/05011;
(Continued)

(56) References Cited

U.S. PATENT DOCUMENTS 5,739,587 A * 4/1998 Sato ........................ H01L 24/03
  257/758
6,100,589 A * 8/2000 Tanaka ................. H01L 23/5283
  257/750
(Continued)

FOREIGN PATENT DOCUMENTS

CN         1574338 A       2/2005
KR  10-2005-0030571 A    3/2005
KR  10-2008-0077287 A    8/2008

OTHER PUBLICATIONS

Korean Office Action dated Jul. 26, 2011 in counterpart Korean Application No. KR 10-2010-0043415 (4 pages, in Korean).
(Continued)

*Primary Examiner* — Marcos D. Pizarro
(74) *Attorney, Agent, or Firm* — NSIP Law

(57) ABSTRACT

A semiconductor device which prevents a crack from occurring on a pad region is provided. The semiconductor device includes a lower pad, an upper pad which is formed above the lower pad, an insulation layer which is formed between the lower pad and the upper pad, a via net for electrically connecting the lower pad and the upper pad in the insulation layer, the via net having a net shape in which a unit grid is connected with its adjacent unit grids to form a net structure, and at least one via hole for electrically connecting the lower pad and the upper pad in the unit grid of the via net.

20 Claims, 15 Drawing Sheets

(51) Int. Cl.
  *H01L 23/58* (2006.01)
  *H01L 23/522* (2006.01)
  *H01L 23/528* (2006.01)

(52) U.S. Cl.
  CPC ............ *H01L 23/585* (2013.01); *H01L 24/03* (2013.01); *H01L 24/04* (2013.01); *H01L 24/05* (2013.01); *H01L 2224/02166* (2013.01); *H01L 2224/04042* (2013.01); *H01L 2224/05011* (2013.01); *H01L 2224/05083* (2013.01); *H01L 2224/05093* (2013.01); *H01L 2224/05094* (2013.01); *H01L 2224/05096* (2013.01); *H01L 2224/05624* (2013.01); *H01L 2224/05666* (2013.01); *H01L 2224/45144* (2013.01); *H01L 2224/45147* (2013.01); *H01L 2224/48624* (2013.01); *H01L 2224/48666* (2013.01); *H01L 2224/48866* (2013.01); *H01L 2924/0105* (2013.01); *H01L 2924/01013* (2013.01); *H01L 2924/01029* (2013.01); *H01L 2924/01033* (2013.01); *H01L 2924/01074* (2013.01); *H01L 2924/01079* (2013.01); *H01L 2924/01082* (2013.01); *H01L 2924/14* (2013.01)

(58) Field of Classification Search
  CPC . H01L 2224/05083; H01L 2224/05093; H01L 2224/05094; H01L 2224/05096
  See application file for complete search history.

(56) References Cited

U.S. PATENT DOCUMENTS

| | | |
|---|---|---|
| 6,448,650 B1 | 9/2002 | Saran et al. |
| 7,312,530 B2 | 12/2007 | Hashimoto et al. |
| 7,741,207 B2 | 6/2010 | Hashimoto et al. |
| 7,741,716 B1 | 6/2010 | Venkitachalam et al. |
| 7,969,008 B2 | 6/2011 | Nagai |
| 2005/0001314 A1 | 1/2005 | Tanaka et al. |
| 2005/0067707 A1* | 3/2005 | Hashimoto ............ H01L 24/03 257/758 |
| 2007/0187823 A1 | 8/2007 | Tanaka et al. |
| 2008/0258262 A1 | 10/2008 | Nagai |
| 2008/0284026 A1 | 11/2008 | Hashimoto et al. |
| 2009/0032957 A1* | 2/2009 | Chang .................... H01L 24/03 257/763 |
| 2009/0032975 A1* | 2/2009 | Do ..................... H01L 23/3171 257/784 |

OTHER PUBLICATIONS

Chinese Office Action dated Jun. 27, 2013 in counterpart Chinese Application No. CN 201010569690.4 (10 pages, in Chinese, with English language translation).
Chinese Office Action dated Jan. 22, 2014 in counterpart Chinese Application No. CN 201010569690.4 (9 pages, in Chinese).
Chinese Office Action dated Aug. 28, 2017 in corresponding Chinese Patent Application No. 201510795521.5 (9 pages in Chinese).

* cited by examiner

SEMICONDUCTOR DEVICE FOR PREVENTING CRACK IN PAD REGION AND FABRICATING METHOD THEREOF

CROSS-REFERENCE TO RELATED APPLICATIONS

This Application is a Divisional Application of U.S. application Ser. No. 12/938,325, filed Nov. 2, 2010, which claims priority from Korean Patent Application No. 10-2010-0043415, filed in the Korean Intellectual Property Office on May 10, 2010, the entire disclosures of which are incorporated herein by reference for all purposes.

BACKGROUND OF THE INVENTION

1. Field of the Invention

Aspects of the present invention relate to a semiconductor device, and more particularly, to a semiconductor device which prevents a crack from occurring on a pad region and a fabricating method thereof.

2. Description of the Prior Art

Generally, a semiconductor device has a pad region which connects an integrated circuit with a package, and the pad region is often pressured by external force in the process of wire-bonding or probing. For instance, a certain pressure is applied to the pad region while the pad is connected to a lead during wire-bonding, and the needle of a probe applies certain pressure on the pad region during probing. As a result, mechanical stress occurs on the pad region and if the stress exceeds a certain level, a crack appears on the pad region.

Although the pad is composed of ductile metal, the insulation layer between the pads is composed of fragile dielectric material. Accordingly, cracks occur more frequently on the insulation layer between the pads. Once a fine crack occurs, the crack continues to extend due to mechanical stress, resulting in a defect in the semiconductor device.

Therefore, a method for preventing a crack from occurring on the pad region of a semiconductor device is required.

SUMMARY OF THE INVENTION

Aspects of the present invention relate to a semiconductor device which prevents a crack from occurring on a pad region and a fabricating method thereof.

A semiconductor device, according to an exemplary embodiment, includes a lower pad, an upper pad which is formed above the lower pad, an insulation layer which is formed between the lower pad and the upper pad, a via net for electrically connecting the lower pad and the upper pad in the insulation layer, the via net having a net shape in which a unit grid is connected with its adjacent unit grids to form a net structure, and at least one via hole for electrically connecting the lower pad and the upper pad in the unit grid of the via net.

The at least one via hole may be disposed symmetrically with respect to a center of the unit grid of the via net.

The at least one via hole may include a first via hole and the first via hole may be disposed at a center of the unit grid of the via net.

The at least one via hole may further include a second, third, fourth, and fifth via holes, and the second, third, fourth, and fifth via holes may be disposed symmetrically with respect to the first via hole.

The unit grid of the via net may have a polygonal shape.

The unit grid of the via net may have a shape which is selected from a group consisting of a triangular, rectangular, hexagonal, and octagonal shapes.

The unit grid of the via net may have a circular shape.

Proportions of conductive metal forming the via net and the at least one via hole in the unit grid of the via net may be from approximately 10% to 75% of entire area of the unit grid.

The lower pad, the upper pad, the insulation layer, and the via net may be stacked in two layers or more.

The lower pad may be formed an insulation layer which is spaced apart from a substrate of the semiconductor device.

A circuit region where an electronic circuit is formed may be disposed below the lower pad.

A method for fabricating a semiconductor device, according to an exemplary embodiment, includes forming a lower pad, forming an insulation layer on the lower pad, forming a via net which has a net shape in which a unit grid is connected with its adjacent unit grids to form a net structure in the insulation layer and at least one via hole in the unit grid, and forming an upper pad on the via net.

The at least one via hole may be formed symmetrically with respect to a center of the unit grid of the via net.

A first via hole may be formed at a center of the unit grid of the via net.

A second, third, fourth, fifth via holes may be formed symmetrically with respect to the first via hole.

The unit grid of the via net may be formed to have a polygonal shape.

The unit grid of the via net may be formed to have a shape which is selected from a group consisting of a triangular, rectangular, hexagonal, and octagonal shapes.

The unit grid of the via net may be formed to have a circular shape.

The proportions of conductive metal forming the via net and the at least one via hole in the unit grid of the via net may be from 10% to 75% of entire area of the unit grid.

Operations of forming the lower pad, the insulation layer, the via net, and the upper pad may be repeated so that the lower pad, the insulation layer, the via net, and the upper pad may be stacked in two layers or more.

The forming the lower pad may include forming the lower pad on an insulation layer which is spaced apart from a substrate of the semiconductor device.

The method may further include, prior to forming the lower pad, forming an electronic circuit below a region where the lower pad is to be formed.

BRIEF DESCRIPTION OF THE DRAWINGS

The above and/or other aspects of the present disclosure will be more apparent by describing certain present disclosure with reference to the accompanying drawings, in which.

DETAILED DESCRIPTION

Figure 1:
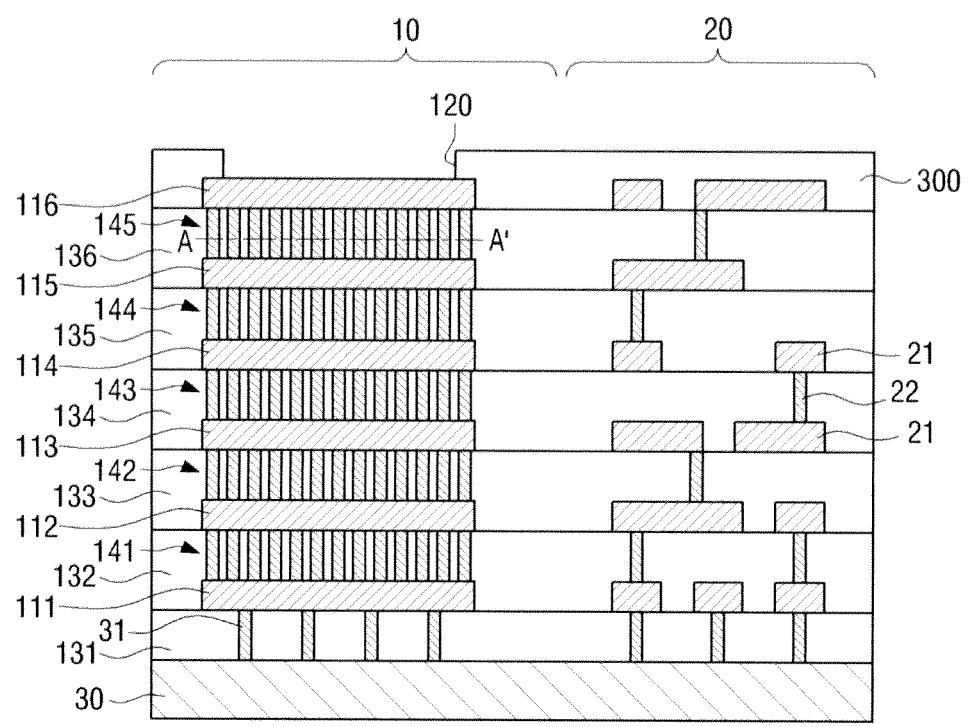
FIG. 1 is a sectional view illustrating a semiconductor device according to an exemplary embodiment.

Certain exemplary embodiments are described in greater detail below with reference to the accompanying drawings.

In the following description, like drawing reference numerals are used for the like elements, even in different drawings. The matters defined in the description, such as detailed construction and elements, are provided to assist in a comprehensive understanding of exemplary embodiments. However, exemplary embodiments can be practiced without those specifically defined matters. Also, well-known functions or constructions are not described in detail since they would obscure the application with unnecessary detail.

In order to provide better understanding of the invention, the views illustrating exemplary embodiments are not drawn on an actual scale, and measurements of some elements may be exaggerated. In addition, the positions of a certain layer or regions in the views indicate only relative positions, and the third layer or region may exist between layers or regions.

The terms which indicate relative positions of elements such as "above" or "below" represent that an element is located on "above" or "below" of another element in contact with another element, but the terms may also represent that an element is located on "above" or "below" another element with a third element in between.

FIG. 1 is a sectional view illustrating a semiconductor device 10 according to an exemplary embodiment.

As illustrated in FIG. 1, the semiconductor device 1, according to an exemplary embodiment, may have a multi-layered structure. In this exemplary embodiment, six insulation layers 131-136 and one protection layer 300 are stacked.

The semiconductor device 1 may be divided into a pad region 10 which is to be connected to a package and a circuit region 20 where an electronic circuit is formed.

The reference numeral 21 in FIG. 1 represents a metal pattern 21 in each layer of the circuit region 20. Such a metal pattern 21 electrically connects electronic elements in the circuit region 20. The via hole 22 in the circuit region 20 electrically connects the metal pattern 21 in different layers. Since those skilled in the related art may easily understand the configuration of the circuit region 20, the detailed description of the same will not be provided. The pad region 10 may be described as below.

A first pad 111 is formed above a substrate 30. A first insulation layer 131 is formed between the first pad 111 and the substrate 30, and the first pad 111 and the substrate 30 may be electrically connected by a contact plug 31. A second pad 112 is formed above the first pad 111, a third pad 113 is formed above the second pad 112, a fourth pad 114 is formed above the third pad 113, a fifth pad 115 is formed above the fourth pad 114, and a sixth pad 116 is formed above the fifth pad 115. The sixth pad 116 which is on top of the pads is exposed to the outside through a pad window 120. Wire-bonding or probing may be performed in the region exposed to the outside through the pad window 120. To perform the wire-bonding, metals such as gold or copper may be used.

A first insulation layer 131 is formed between the substrate 30 and the first pad 111, a second insulation layer 132 is formed between the first pad 111 and the second pad 112, a third insulation layer 133 is formed between the second pad 112 and the third pad 113, a fourth insulation layer 134 is formed between the third pad 113 and the fourth pad 114, a fifth insulation layer 135 is formed between the fourth pad 114 and the fifth pad 115, and a sixth insulation layer 136 is formed between the fifth pad 115 and the sixth pad 116.

A first via net 141 electrically connects the first pad 111 and the second pad 112 in the second insulation layer 132, a second via net 142 electrically connects the second pad 112 and the third pad 113 in the third insulation layer 133, a third via net 143 electrically connects the third pad 113 and the fourth pad 114 in the fourth insulation layer 134, a fourth via net 144 electrically connects the fourth pad 114 and the fifth pad 115 in the fifth insulation layer 135, and a fifth via net 145 electrically connects the fifth pad 115 and the sixth pad 116 in the sixth insulation layer 136.

The protection layer 300 is formed on the sixth insulation layer 136 which is on top of the layers and protects the semiconductor device below.

Figure 2A:
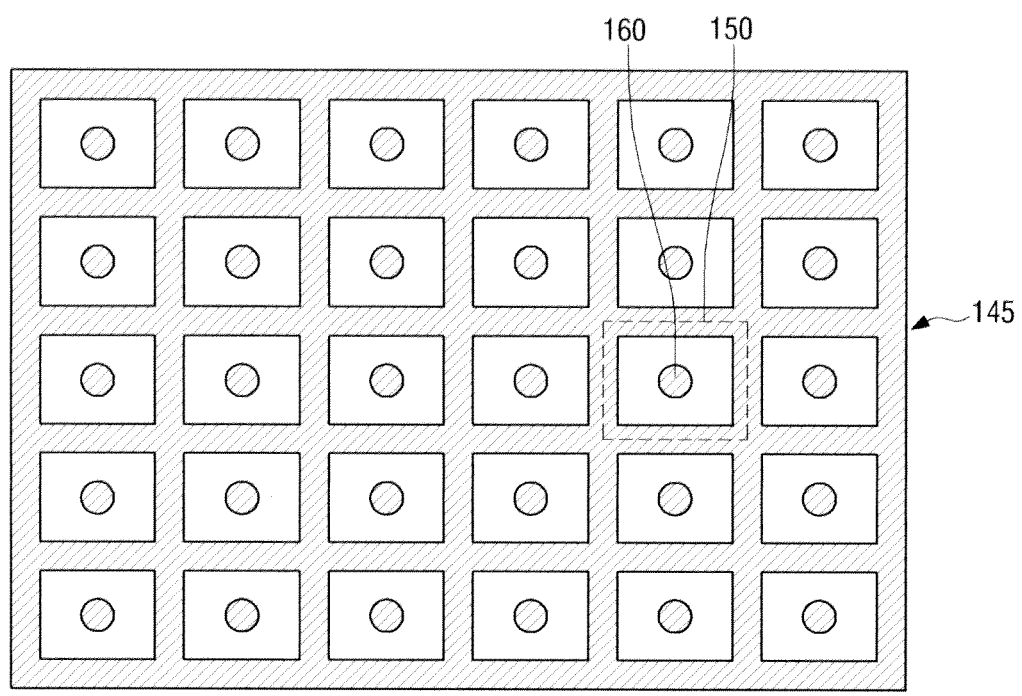
FIGS. 2A-2F are top views of the semiconductor device which is cut along the line A-A' in FIG. 1.

FIG. 2A is a top view of the semiconductor device which is cut along the line A-A' in FIG. 1. The via nets 141-145 will be explained in detail with reference to FIG. 2A.

As illustrated in FIG. 2A, the fifth via net 145 has a net shape in which there are a plurality of unit grids 150 (only one of the unit grids is shown with a reference number). Each of the unit grids is in contact with its adjacent unit grid to form a net structure, and a via hole 160 which electrically connects the fifth pad 115 and the sixth pad 116 is formed in the unit grid 150. In order to electrically connect the fifth and the sixth pad 115, 116, the fifth via net 145 and the via hole 160 may be composed of conductive metal (such as, tungsten).

In FIG. 2A, the unit grid 150 of the fifth via net 145 has a rectangular shape, but the shape of the unit grid 150 may vary depending on exemplary embodiments, which will be explained below.

While wire-bonding or probing is performed through the pad window 120, external force may be applied to the sixth pad 116, and thus mechanical stress may occur on the pad region 10. As a result, a crack may occur on the insulation layers 131-135 which is composed of fragile dielectric materials. However, as illustrated in FIG. 2A, the fifth via net 145 has a net shape in which the unit grid 150 is connected with each other, and thus the fifth via net 145 is strong enough to endure the external force and disperses the mechanical stress. Accordingly, a crack may be prevented from occurring on the insulation layers 131-136.

Even if a crack occurs on the insulation layers 131-136, the unit grid 150 of the fifth via net 145 prevents the crack from spreading and the crack stays within the unit grid 150.

In addition, since the fifth via net 145 having a net shape increases via density, adhesive property between the sixth pad 116 and the sixth insulation layer 136 below the sixth pad 116 may be enhanced. Consequently, packaging yield may be also improved.

In this case, the proportions of the conductive metal consisting of the fifth via net 145 and the via hole 160 in the unit grid 150 of the fifth via net 145 may be approximately 10-75% of the entire area of the unit grid 150. If the conductive metal occupies less than approximately 10% of the entire area, the proportions of insulation materials become larger, and thus external force applied during wire-bonding or probing may not be endured. On the other hand, if the conductive metal occupies more than approximately 75% of the entire area, it becomes difficult to pattern the via hole 160 within the unit grid 150. If a plurality of via holes 160a-e are formed in the unit grid 150, which will be explained below with reference to FIG. 2A, the plurality of via holes 160a-e may stick to each other, and thus the proportions of the via holes may increase. On top of that, removing residue in a later process may compromise a crack preventing effect.

In the exemplary embodiment, description regarding only the fifth via net 145 is provided. Since the first to the fourth via nets 141-144 have the same structure as the fifth via net 145, description regarding the first to the fourth via nets 141-144 will not be provided.

In FIG. 2A, the via hole 160 in the unit grid 150 of the fifth via net 145 may be disposed at the center of the unit grid 150. If the via hole 160 is not disposed at the center of the unit grid 150, stress may be concentrated on a certain region of the unit grid 150 due to asymmetry.

Figure 2B:
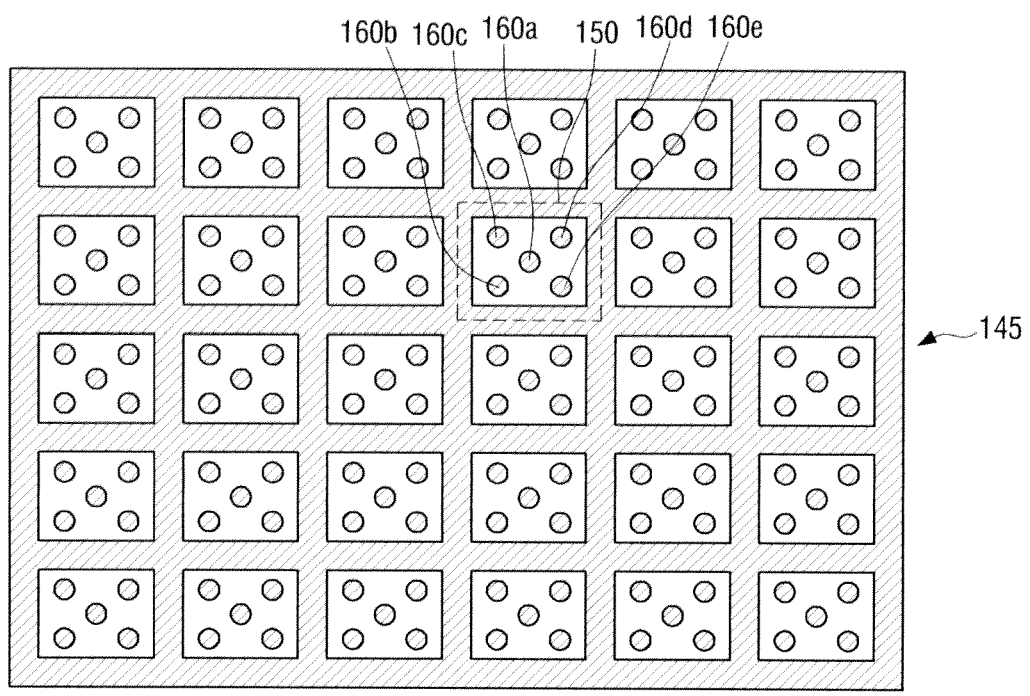

FIG. 2B is another exemplary embodiment, which is different from FIG. 2A in that a plurality of via holes 160a-e, instead of one via hole, are formed in the unit grid 150 of the fifth via net 145. As explained above, a plurality of via holes 160a-e are disposed symmetrically with respect to the center of the unit grid 150 in order to prevent the stress from being concentrated on a certain region. That is, the first via hole 160a is disposed at the center of the unit grid 50, and the second to fifth via holes 160b-e are disposed symmetrically with respect to the first via hole 160a which is at the center of the unit grid 150. In the exemplary embodiment, five via holes 160a-e are formed in the unit grid 150, but the number of via holes formed in the unit grid 150 may vary depending on an exemplary embodiment.

Figure 2C:
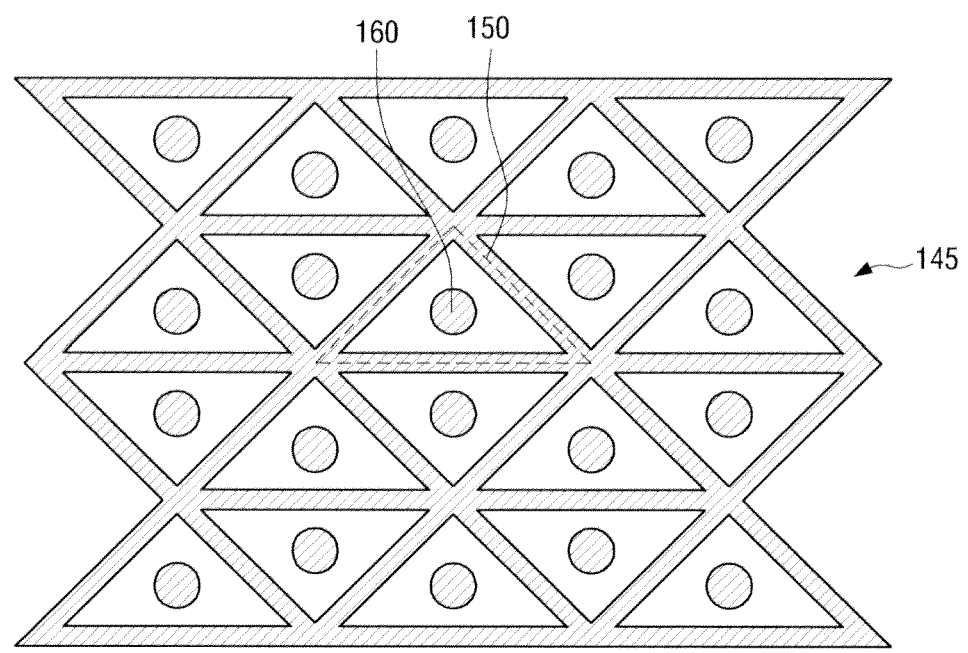

FIG. 2C is another exemplary embodiment, which is different from FIG. 2A in that the unit gird 150 of the fifth via net 145 has a triangle shape instead of a rectangular shape. Although the shape of the unit gird 150 is different, the fifth via net 145 has the same effect of preventing a crack since it also has a net shape in which the unit grid 150 is connected with each other. It should be noted that there may also be more than one via holes 160 formed in the unit grid 150 depending on an exemplary embodiment.

Figure 2D:
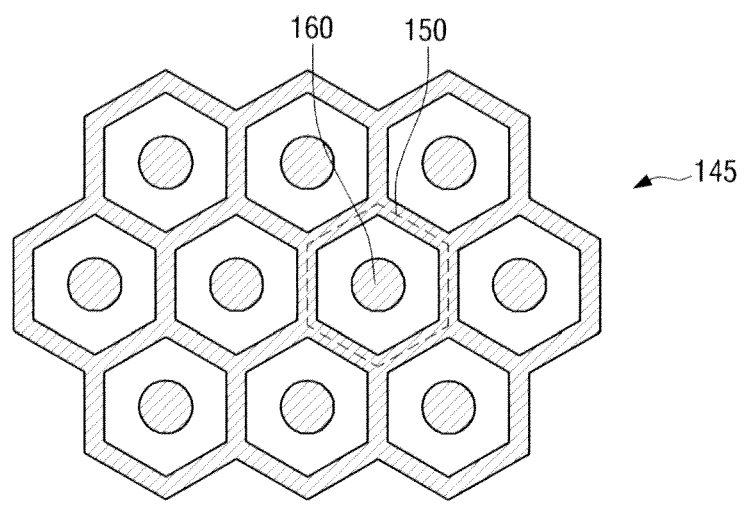

FIG. 2D is another exemplary embodiment, which is different from FIG. 2A in that the unit grid 150 of the fifth via net 145 has a hexagonal shape instead of a rectangular shape. Although the shape of the unit gird 150 is different, the fifth via net 145 has the same effect of preventing a crack since it also has a net shape in which the unit grid 150 is connected with each other. It should be noted that there may also be more than one via holes 160 formed in the unit grid 150 depending on an exemplary embodiment.

Figure 2E:
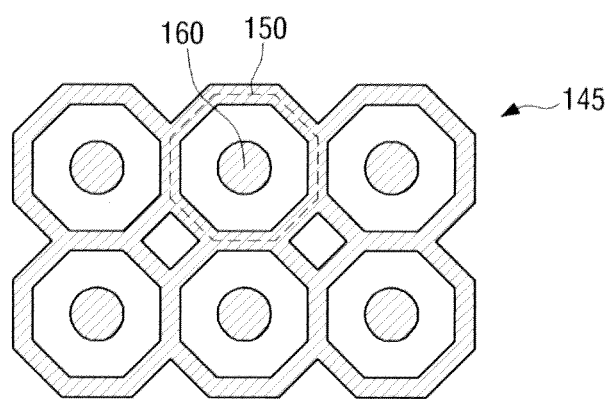

FIG. 2E is another exemplary embodiment, which is different from FIG. 2A in that the unit grid 150 of the fifth via net 145 has an octagonal shape instead of a rectangular shape. Although the shape of the unit gird 150 is different, the fifth via net 145 has the same effect of preventing a crack since it also has a net shape in which the unit grid 150 is connected with each other. It should be noted that there may also be more than one via holes 160 formed in the unit grid 150 depending on an exemplary embodiment.

Figure 2F:
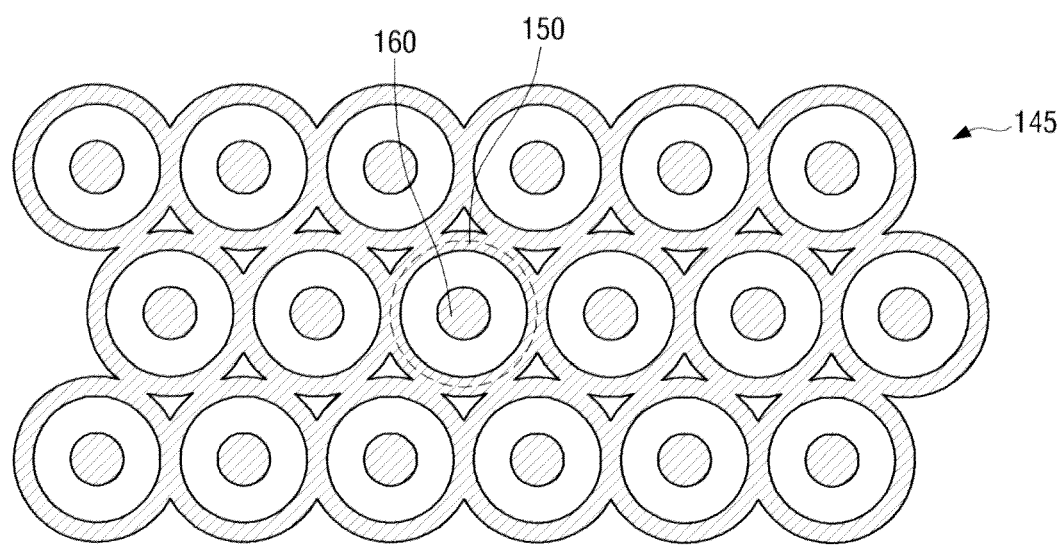

FIG. 2F is another exemplary embodiment, which is different from FIG. 2A in that the unit grid 150 of the fifth via net 145 has a circular shape instead of a rectangular shape. Although the shape of the unit gird 150 is different, the fifth via net 145 has the same effect of preventing a crack since it also has a net shape in which the unit grid 150 is connected with each other. It should be noted that there may also be more than one via holes 160 formed in the unit grid 150 depending on an exemplary embodiment.

FIGS. 3A-3F are schematic views illustrating the process of fabricating the semiconductor device 1 in FIG. 1. The method for fabricating the semiconductor device 1 according to an exemplary embodiment will be explained with reference to FIGS. 3A-3F.

Figure 3A:
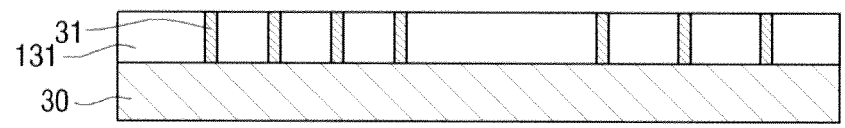
FIGS. 3A-3G are schematic views illustrating the process of fabricating the semiconductor device in FIG. 1.

First of all, the first insulation layer 131 and the contact plug 31 are formed on the substrate 30 as illustrated in FIG. 3A. To do so, the operation of deposition, selective etching, and grinding may be performed.

Figure 3B:
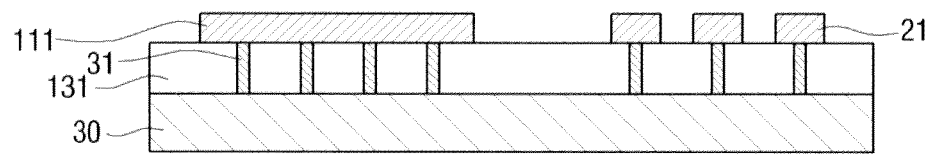

Subsequently, the first pad 111 is formed on the contact plug 31 as illustrated in FIG. 3B. To do so, the operations of deposition, selective etching, and grinding may be performed. The method for forming the first pad 111 will not be explained in detail since those skilled in the related art may easily understand the method. When the first pad 111 is formed, the metal pattern 21 in the circuit region 20 may also be formed simultaneously.

Figure 3C:
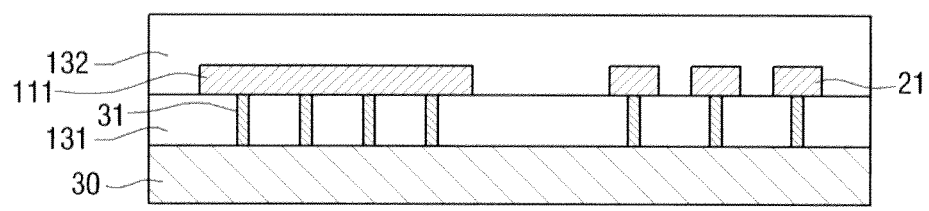

The second insulation layer 132 may be formed on the first pad 111 as illustrated in FIG. 3C. To do so, the operations of deposition and grinding may be performed. The method for forming the second insulation layer 132 will not be explained in detail since those skilled in the related art may easily understand the method.

Figure 3D:
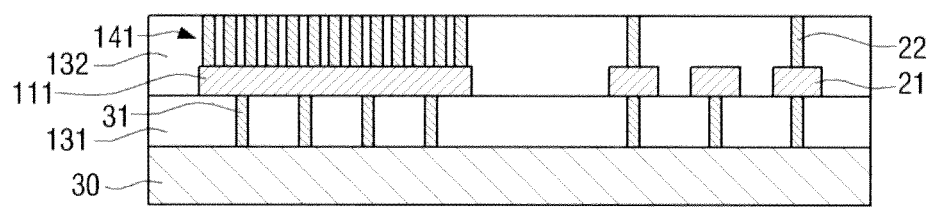

Subsequently, the first via net 141 in the second insulation layer 132 and the via hole in the unit grid of the first via net 141 are formed as illustrated in FIG. 3D. To do so, the operations of selective etching, deposition, grinding, sputtering, and W plug may be performed. For example, photoresist is applied to the top surface of the second insulation layer 132 and a via pattern corresponding to the first via net 141 or and the via hole in the unit grid of the first via net 141 is formed through the process of exposing and developing. The second insulation layer 132 is etched using such a via pattern as a mask and part of the first pad 111 is exposed. Subsequently, the via pattern is removed and a thin barrier metal layer is deposited on the etched area of the second insulation layer 132. The barrier metal layer is deposited to enhance adhesion between the second insulation layer 132 and tungsten (W) which will be deposited later. Ti/TiN may be used as the barrier metal layer. Subsequently, tungsten (W) is deposited on the barrier metal layer using a chemical vapor deposition (CVD) method. In addition, chemical mechanical polishing (CMP) or etch back processing is performed to remove tungsten (W) and the barrier metal layer that are located above the second insulation layer 132. Accordingly, the first via net 141 and the via hole in the unit grid of the first via net 141 are formed. In this case, the first via net 141 may have the same shape as those illustrated in FIGS. 2A-2F. When the via net 141 is formed, the via hole 22 in the circuit region 20 may also be formed simultaneously.

Figure 3E:
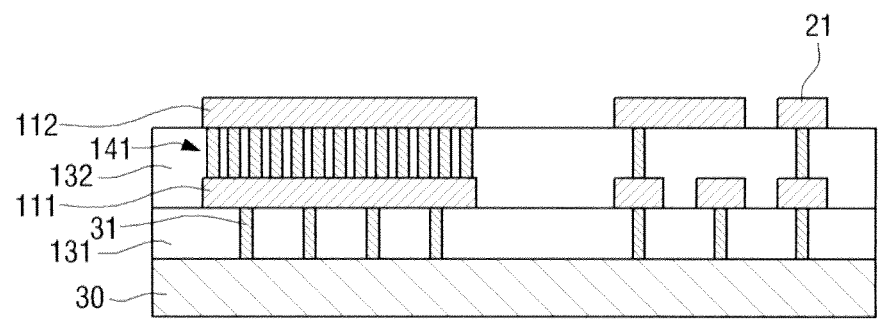

The second pad 112 may be formed on the first via net 141 as illustrated in FIG. 3E. To do so, the operations of deposition, selective etching, and grinding may be performed. When the second pad 112 is formed, the metal pattern 21 in the circuit region 20 may also be formed simultaneously. In this exemplary embodiment, the second pad 112 is formed separately from the first via net 141, but the second pad 112 and the first via net 141 may be formed at the same time.

Figure 3F:
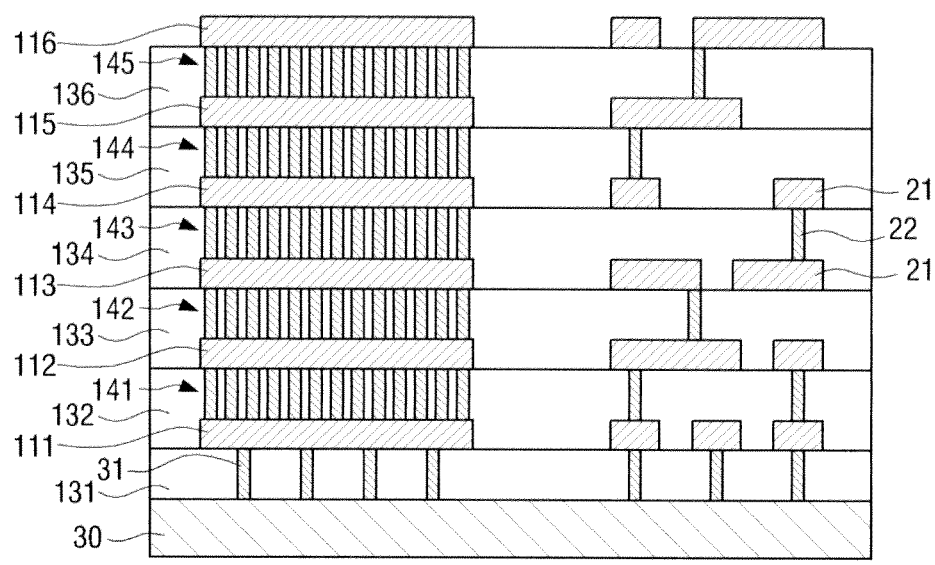

If the above-mentioned process is repeated, multi-layered structure is formed as illustrated in FIG. 3F.

The sixth pad 116 which is on top of the multi-layers may be composed of metal such as aluminum and copper. If the sixth pad 116 is composed of aluminum, refractory metal may be additionally formed on top and bottom of the aluminum. Such refractory metal includes Ti, TiN, and TiW. For instance, the sixth pad 116 on top of the multi-layers may be composed of Ti/Al/TiN (top) or Ti/TiN/Al/TiN (top). Since refractory metal is additionally formed on the sixth pad 116 which is exposed to the outside, a crack may be prevented from occurring more effectively.

Figure 3G:
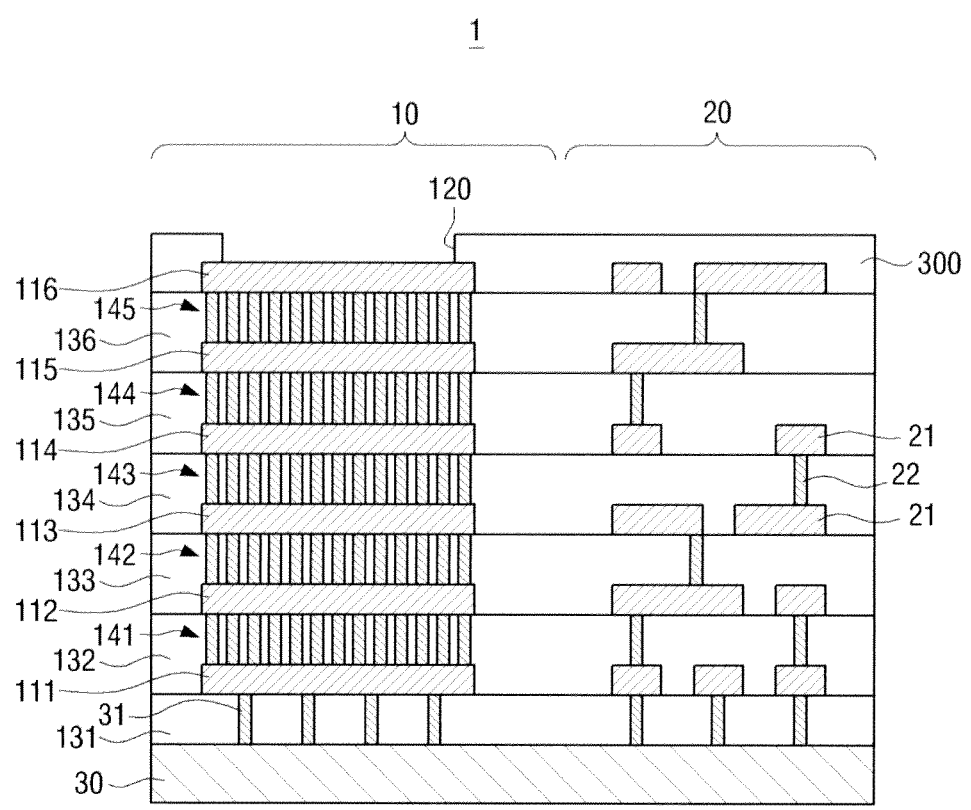

Subsequently, the protection layer 300 having the pad window 120 is formed on the sixth insulation layer 136 as illustrated in FIG. 3G.

The semiconductor device 1 according to an exemplary embodiment may be formed following the above process.

Figure 4:
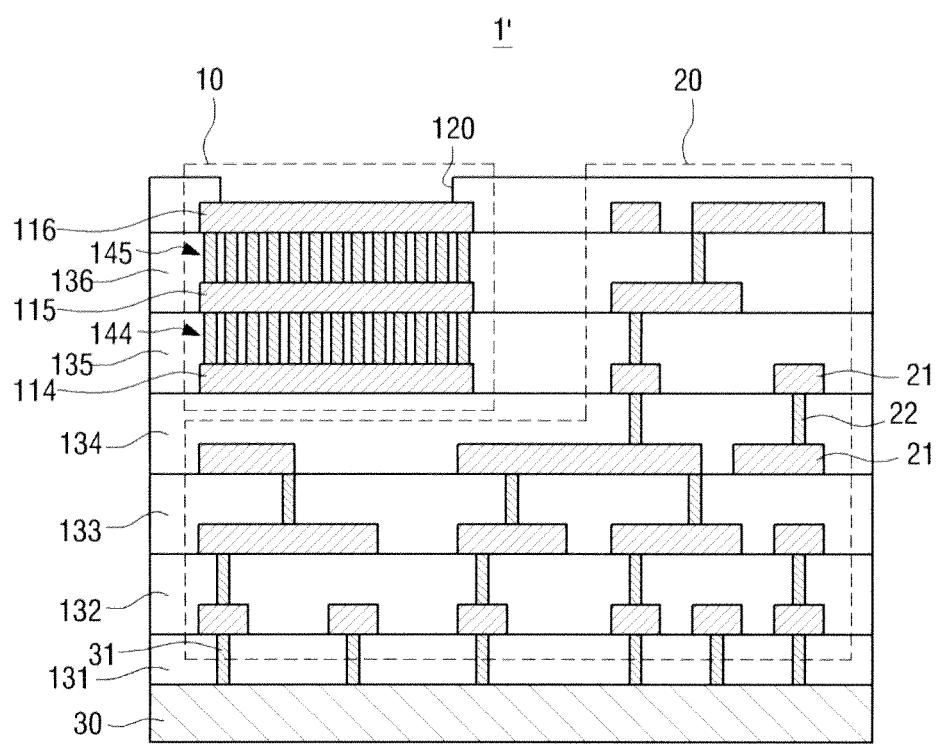
FIG. 4 is a sectional view of a semiconductor device according to another exemplary embodiment.

FIG. 4 is a sectional view of a semiconductor device 1' according to another exemplary embodiment. In the following description, like drawing reference numerals are used for the elements which perform like functions, and detailed explanation regarding the elements which have already been mentioned above will not be provided.

The exemplary embodiment in FIG. 4 is different from that in FIG. 1 in that the first to third pads 111-113 do not exist in FIG. 4. That is, the pad region 10 comprises only the fourth to sixth pads 114-116 and the fourth and fifth via nets 144, 145, and the fourth pad 114 of the lowest bottom in the pad region 10 is formed on the fourth insulation layer 134 which is spaced apart from the substrate 30. Accordingly, the pads 114-116 are formed only a certain layer instead of every layer of the semiconductor device 1. Since there is a possibility that a crack may occur on the pad region 10, the circuit region 20 is generally not disposed below the pad region 10. However, according to an exemplary embodiment, the circuit region 20 in which an electronic circuit is formed may be disposed below the pad region 10 as illustrated in FIG. 4 since the present invention can prevent a crack from occurring on the pad region 10. Therefore, it is possible to increase circuit density and to make the semiconductor device 1' small and compact.

In the exemplary embodiment regarding FIG. 4, the fourth and fifth via nets 144, 145 are used, but only the fifth via net 145 may exist and common via structure may be used for the connection of the fourth and fifth pad 114, 115. This may also be applied to the previously mentioned exemplary embodiments because if relatively weak force is applied to the pad region 10 during wire-bonding or probing, only the via net 145 between the sixth pad 116 which is exposed to the outside and the fifth pad 115 which is formed below the sixth pad is needed to prevent a crack from occurring. Thus, it should be appreciated that a via net may exist only in a certain layer and common via structure may be used in the remaining layers.

In the exemplary embodiment regarding FIG. 4, the first and third pads 111-113 do not exist, but the first to fourth pads 111-114 may not exist and the pad region 10 may be composed of only the fifth and sixth pad 115, 116 and the fifth via net 145. As such, the number of pads may change arbitrarily.

Although a few embodiments of the present invention have been shown and described, it should be appreciated by those skilled in the art that changes may be made in this embodiment without departing from the principles and spirit of the invention, the scope of which is defined in the claims and their equivalents.

What is claimed is:

1. A method for fabricating a semiconductor device, the method comprising:
    forming electronic circuits on a substrate;
    forming a lower pad on a first insulation layer formed on the electronic circuits;
    forming a second insulation layer on the lower pad;
    forming a plurality of unit grids in the second insulation layer to form a via net; and
    forming an upper pad on the via net,
    wherein each unit grid has five via holes isolated from each other by the second insulation layer, such that first to fourth via holes are disposed symmetrically with respect to a fifth via hole disposed at a center of each unit grid of the via net,
    wherein the electronic circuits comprise metal patterns for electrically connecting electronic elements and via holes for connecting the metal patterns in different layers, and
    wherein the electronic circuits are overlapped with the lower pad.

2. The method as claimed in claim 1, wherein a spacing between via holes in each unit grid of the via net is narrower than a spacing between via holes in the electronic circuits.

3. A method for fabricating a semiconductor device, the method comprising:
    forming a first insulation layer on a substrate;
    forming contact plugs in the first insulation layer;
    forming a first pad and a first metal pattern on the first insulation layer, the first pad and the first metal pattern being connected with respective contact plugs;
    forming a second insulation layer on the first pad and the first metal pattern;
    forming a first via net in the second insulation layer, the first via net comprising first unit grids and each of the first unit grids comprising first via holes;
    forming second via holes connected with the first metal pattern in the second insulation layer, the first and second via holes being simultaneously formed; and
    forming a second pad and a second metal pattern on the second insulation layer,
    wherein each of the first unit grids has five via holes isolated from each other by the second insulation layer, such that first to fourth via holes are disposed symmetrically with respect to a fifth via hole disposed at a center of each of the first unit grids of the first via net, and
    wherein each of the first via holes is surrounded by the second insulation layer.

4. The method as claimed in claim 3, further comprising:
    forming a third insulation layer on the second pad;
    forming a second via net in the third insulation layer, the second via net comprising second unit grids and each of the second unit grids comprising third via holes; and
    forming a top pad on the second via net,
    wherein each of the third via holes is surrounded by the third insulation layer.

5. A method for fabricating a semiconductor device, the method comprising:
    forming electronic circuits on a substrate;
    forming a first insulation layer on the electronic circuits;
    forming a lower pad on the first insulation layer such that the electronic circuits are overlapped with the lower pad;
    forming a second insulation layer on the lower pad;
    forming a via net which has a net shape in which a unit grid is connected with its adjacent unit grids to form a net structure in the second insulation layer; and
    forming an upper pad on the via net,
    wherein the unit grid has five via holes isolated from each other by the second insulation layer, such that first to fourth via holes are disposed symmetrically with respect to a fifth via hole disposed at a center of the unit grid of the via net.

6. The method as claimed in claim 5, wherein a spacing between via holes in the unit grid is narrower than a spacing between via holes in the electronic circuits.

7. The method as claimed in claim 5, wherein the unit grid of the via net has a rectangular shape.

8. The method as claimed in claim 5, wherein each of the first to fourth via holes is disposed at respective corners of the unit grid of the via net.

9. The method as claimed in claim 5, wherein the unit grid of the via net is formed to have a circular shape.

10. The method as claimed in claim 5, wherein a conductive metal forming at least one via hole in the unit grid of the via net occupies from approximately 10% to 75% of an entire area of the unit grid.

11. The method as claimed in claim 5, wherein operations of forming the lower pad, the second insulation layer, the via net, and the upper pad are repeated so that the lower pad, the second insulation layer, the via net, and the upper pad are stacked in at least two layers.

12. The method as claimed in claim 5, wherein the electronic circuits are overlapped with the via net and the upper pad, respectively.

13. The method as claimed in claim 5, wherein each of the five via holes is surrounded by the second insulation layer.

14. The method as claimed in claim 5, wherein the unit grid of the via net is formed to have a polygonal shape.

15. The method as claimed in claim 14, wherein the unit grid of the via net is formed to have a shape which is at least one of a triangular, rectangular, hexagonal, and octagonal shapes.

16. The method as claimed in claim 5, wherein the forming the lower pad comprises forming the lower pad on the first insulation layer which is spaced apart from the substrate of the semiconductor device.

17. The method as claimed in claim 16, wherein the electronic circuits are formed on the substrate prior to forming the lower pad.

18. The method as claimed in claim 5, further comprising:
forming a third insulation layer on the upper pad;
forming a second via net in the third insulation layer; and
forming a top pad on the second via net.

19. The method as claimed in claim 18, wherein the top pad comprises an aluminum (Al) and a refractory metal.

20. The method as claimed in claim 19, wherein the refractory metal comprises titanium (Ti) and titanium nitride (TiN) or Ti and titanium tungsten (TiW).

* * * * *